United States Patent
Nirschl et al.

(10) Patent No.: US 7,982,488 B2
(45) Date of Patent: Jul. 19, 2011

(54) PHASE-CHANGE MEMORY SECURITY DEVICE

(75) Inventors: Thomas Nirschl, Munich (DE); Berndt Gammel, Markt Schwaben (DE); Stefan Rueping, Lengdorf (DE); Ronald Kakoschke, Munich (DE); Gerd Dirscherl, Munich (DE); Philip Schlazer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 26 days.

(21) Appl. No.: 12/474,648

(22) Filed: May 29, 2009

(65) Prior Publication Data
US 2010/0301896 A1 Dec. 2, 2010

(51) Int. Cl.
*H03K 19/00* (2006.01)
*G11C 11/34* (2006.01)

(52) U.S. Cl. .................................. 326/8; 365/185.04

(58) Field of Classification Search ............. 365/63, 365/163, 185.04; 257/2, 4; 438/102; 326/8–15
See application file for complete search history.

(56) References Cited

U.S. PATENT DOCUMENTS

| | | | |
|---|---|---|---|
| 7,397,061 B2 * | 7/2008 | Johnson | 257/2 |
| 7,502,256 B2 * | 3/2009 | Merry et al. | 365/185.04 |
| 2005/0029503 A1 * | 2/2005 | Johnson | 257/4 |
| 2006/0076413 A1 | 4/2006 | Kund et al. | |
| 2009/0154215 A1 * | 6/2009 | Parikh et al. | 365/63 |
| 2009/0196100 A1 * | 8/2009 | Merry et al. | 365/185.04 |
| 2009/0298224 A1 * | 12/2009 | Lowrey | 438/102 |
| 2009/0323384 A1 * | 12/2009 | Lam et al. | 365/49.17 |
| 2010/0165715 A1 * | 7/2010 | Donze et al. | 365/163 |
| 2010/0182147 A1 * | 7/2010 | Rueping et al. | 340/541 |

* cited by examiner

*Primary Examiner* — Vibol Tan
(74) *Attorney, Agent, or Firm* — Dickstein Shapiro LLP

(57) ABSTRACT

A semiconductor chip having a subcircuit formed in a substrate; and a phase-change memory cell located on the subcircuit, and configured to directly detect an attack on the subcircuit, or to form a shield to prevent physical access to the subcircuit.

20 Claims, 6 Drawing Sheets

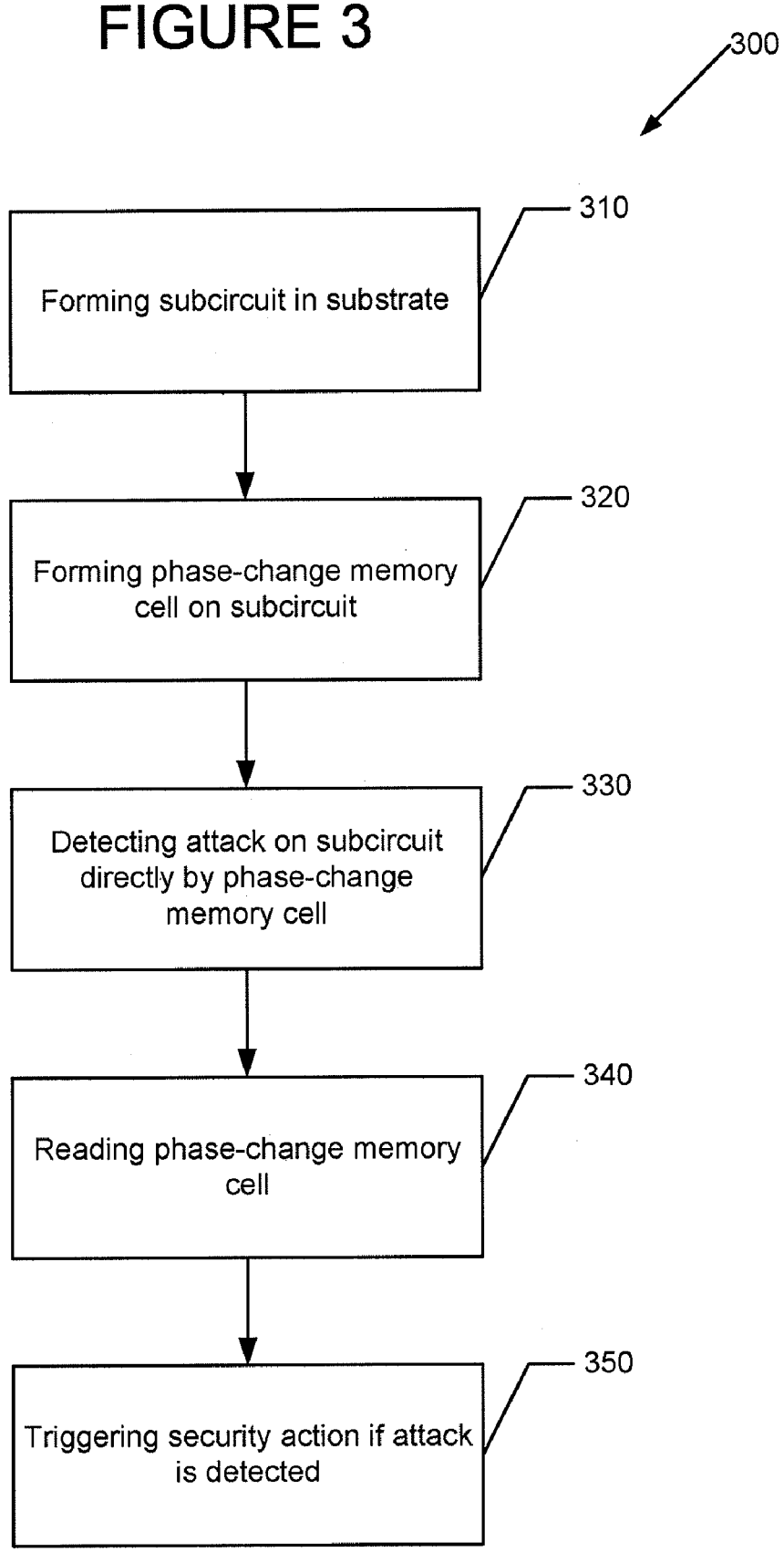

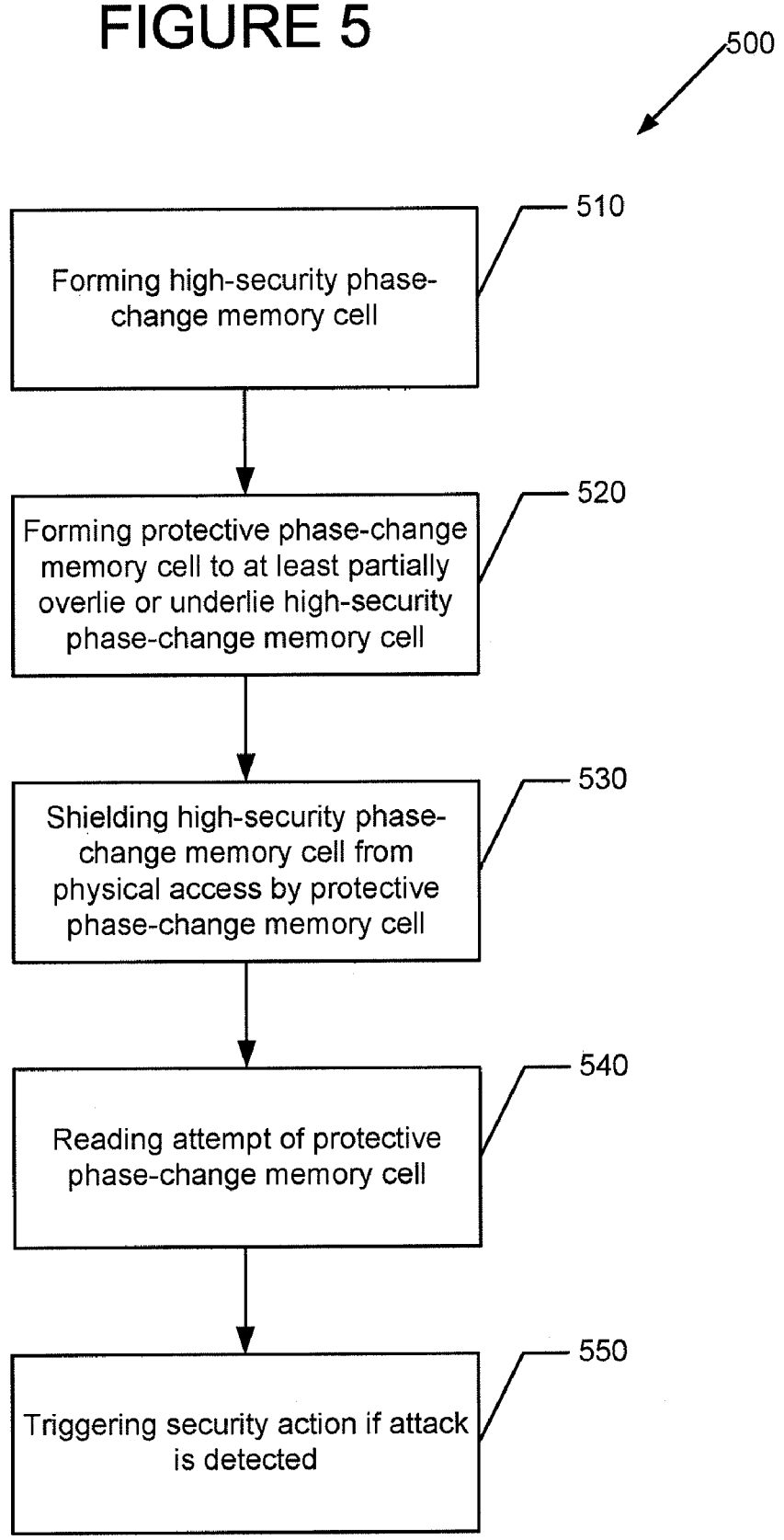

US 7,982,488 B2

PHASE-CHANGE MEMORY SECURITY DEVICE

BACKGROUND

Phase-change memory (also known as PCM, PRAM, PCRAM, Chalcogenide RAM and C-RAM) is a type of non-volatile memory device that employs a reversible phase-change material to store information.

Phase-change memory uses a medium such as chalcogenide, the physical state of which can be reversibly changed between crystalline and amorphous through the application of heat. The physical states have different electrical resistance properties that can be easily measured, making chalcogenide useful for data storage.

In the amorphous phase, the material is highly disordered, that is there is an absence of regular order to the crystalline lattice. In this phase, the material demonstrates high resistivity and high reflectivity. In contrast, in the crystalline phase, the material has a regular crystalline structure and exhibits low reflectivity and low resistivity.

Phase-change memory uses electrical current to trigger the structural change. An electrical charge just a few nanoseconds in duration melts the chalcogenide in a given location. When the charge ends, the location's temperature drops so quickly that the disorganized atoms freeze in place before they can rearrange themselves back into their regular, crystalline order.

Going in the other direction, the process applies a longer, less-intense current that warms the amorphous patch without melting it. This energizes the atoms just enough that they rearrange themselves into a crystalline lattice, which is characterized by lower energy or electrical resistance.

To read recorded information, a probe measures the electrical resistance of the location. The amorphous state's high resistance is read as a binary 0, while the lower-resistance, crystalline state is a 1.

FIG. 6 illustrates a cross-section of a phase-change memory cell 600 formed over a substrate 610. The substrate 610 includes a conductive line 620 coupled to a selection device 630. The selection device 630 may be, for example, a diode, a transistor, or other similar device. The selection device 630 is electrically coupled to a lower electrode 640 formed in a pore 650. The pore 650 is defined as an aperture in an insulating layer 660. Sidewall spacers 670 are formed in the pore 650. A phase-change material 680 is formed in the pore 650 and over the insulator 660. An upper electrode or conductive line 690 is formed over the phase-change material 680. The phase-change material 680 may be set to a desired resistance by varying the magnitude of the applied current.

Semiconductor chips have been the subject of attacks to read data or manipulate circuit operation. As an example, one type of attack technique involves looking through a substrate of the semiconductor chip from the rear using an infrared laser having a wavelength at which the substrate is transparent. The photocurrents created enable probing of the semiconductor chip operation and identification of logic states of individual transistors.

There have been numerous techniques used to prevent such attacks. For example, semiconductor chips have been formed with multiple layers to hide sensitive data lines.

Protective layers have also been used to prevent analysis of real time data processing. A top layer may have an active grid carrying a protection signal. Interruptions of the protection signal cause the semiconductor chip to erase its memories and cease operation.

Protective circuits have also been used to protect the semiconductor chip by preventing unauthorized retrieval of the secure information.

Conductive bridging memory devices have also been used in combination with a photodiode to detect an unauthorized manipulation or access. The photodiode is used as the sensor, converting optical energy to electrical energy. The conductive bridging memory device is electrically switched using the electrical energy. Thus, both the photodiode as well as a memory device are needed to detect the attack.

Another type of attack involves placing probes or needles on the semiconductor chip and listening to information, or forcing specific signals on the semiconductor chip in order to generate a behavior supporting the attack.

One protection mechanism against a probe attack involves a passive or active shield placed on top of security critical portions of the semiconductor chip, so that an attacker can not directly read the chip's signals. Passive shields are typically effective in preventing viewing of the chip and making attacks more time-consuming. Passive shields may be removed, however, without affecting the operation of the device. Active shields may look similar to passive shields. However, a breach in an active shield is typically detected and normally results in disabling the chip.

Another protection mechanism involves using a specific encryption or masking of the signals, rendering the signals useless to an attacker.

BRIEF DESCRIPTION OF THE DRAWINGS

FIG. 3 illustrates a flowchart of a security method corresponding to the smart card semiconductor chips of FIGS. 2A-2C.

FIG. 5 illustrates a flowchart of a security method corresponding to the smart card semiconductor chips of 4A and 4B.

DETAILED DESCRIPTION

Figure 1:
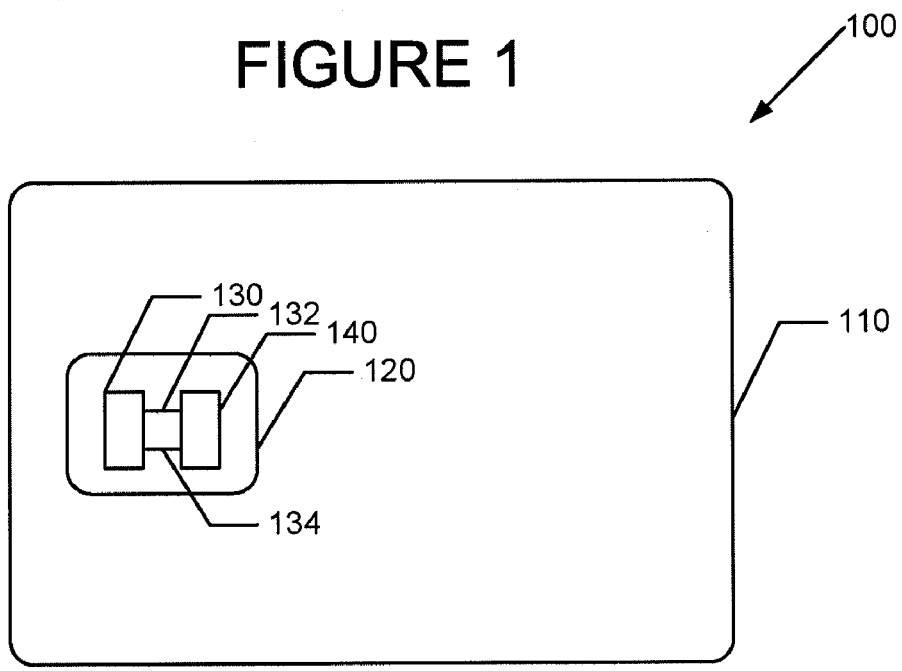
FIG. 1 is a schematic representation of a smart card.

FIG. 1 is a schematic representation of a smart card 100, also known as a chip card, RFID tag, integrated circuit (IC) card, or proximity IC card (PICC), 100 in accordance with an exemplary embodiment. A smart card is a pocket-sized card with a semiconductor chip that can process information. These cards can receive an input which is processed and subsequently delivered as an output. A contactless card or proximity card is a specific type of IC card, namely, a contactless integrated circuit device that can be used for applications such as security access or payment systems. These cards operate on the basis of communication by an electromagnetic field with a read and/or write interrogating device, generically referred to as a reader. In other configurations, IC cards have also been designed to communicate with external devices such as a host personal computer, smart card adapters and connectors, and the like.

Smart card 100 includes housing 110, which is generally comprised of plastic and houses semiconductor chip 120. Semiconductor chip 120 has a circuit 130 including at least one subcircuit and at least one phase-change memory cell, as will be described in more detail below, coupled with processor 140 via conductive lines 132, 134. A subcircuit is defined as any portion of circuit 130 of semiconductor chip 120.

Figure 2A:
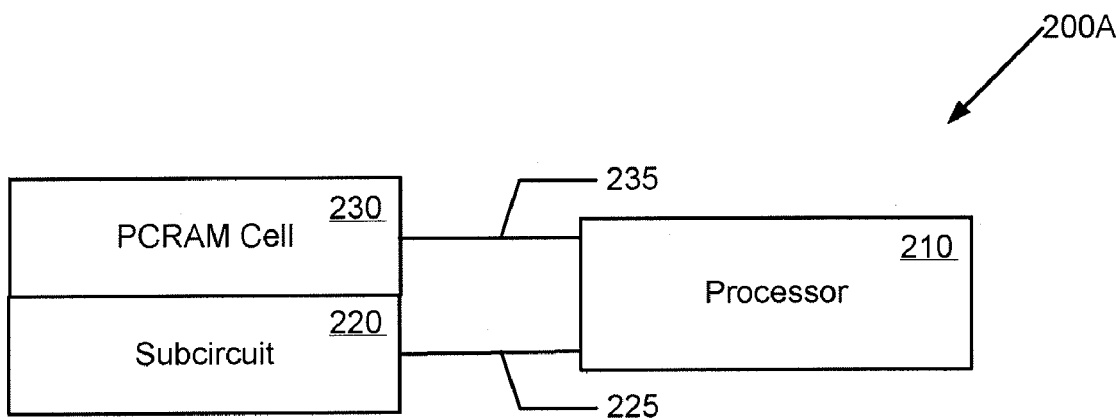
FIG. 2A illustrates a block diagram of a smart card semiconductor chip in accordance with an exemplary embodiment.

FIG. 2A illustrates a block diagram of a smart card semiconductor chip 200A in accordance with an exemplary embodiment. Smart card semiconductor chip 200A is equivalent to smart card semiconductor chip 120 of smart card 100 shown in FIG. 1.

Smart card semiconductor chip 200A includes processor 210, subcircuit 220 formed in a substrate, and PC RAM cell or phase-change memory cell 230 formed on subcircuit 220. Subcircuit 220 is coupled to processor 210 via conductive line 225, and phase-change memory cell 230 is coupled to processor 210 via conductive line 235. Subcircuit 220 and processor 210 perform the operations of smart card semiconductor chip 200A. Phase-change memory cell 230 is added for security against attacks, such as light attacks, as will be described in more detail below.

Phase-change memory cell 230 may be placed on or close to subcircuit 220 to detect an attack on subcircuit 220. In an alternative embodiment, an opening (not shown) may be formed within the substrate in which subcircuit 220 is formed, and phase-change memory cell 230 may be formed within the opening.

Phase-change memory cell 230 is configured to detect an unauthorized attack by a laser or other light source. If light from a laser or the like is applied to semiconductor chip 200A near subcircuit 220, phase-change memory cell 230 changes its physical state in the manner discussed above, and thus its content is changed. Since the substrate is transparent to lasers at certain wavelengths, phase-change memory cell 230 located close to or within the substrate can detect a backside light attack, that is a light attack from the substrate side of the semiconductor chip 200A.

One way to determine if the content of phase-change memory cell 230 has been changed is through the use of a checksum. A checksum is a fixed-size datum computed from an arbitrary block of digital data for the purpose of detecting errors in stored data. If a checksum is stored in phase-change memory cell 230, and an attacker applies light to the smart card housing semiconductor chip 200A, several bits of the checksum will be flipped. The integrity of the data can be checked at any later time by recomputing the checksum and comparing it with the stored checksum. If the checksums do not match, it is determined that the data was altered. Of course the application is not limited to checking the data via the use of a checksum. Any known method suitable for the intended purpose may be used.

The change in state of phase-change memory cell 230 can be detected electrically by processor 210 directing a current through phase-change memory cell 230 and measuring the voltage or electrical resistance across phase-change memory cell 230 via conductive line 235. If processor 210 detects a change in state, a light attack is thereby detected, and a security action may be triggered. The security action may be generating an alarm and/or taking other protective action, such as circuit shut-down, erasing of data, etc.

Processor 210 may check the state of phase-change memory cell 230 at any time suitable. In one embodiment, processor 210 checks the state of phase-change memory cell 230 during start-up. In an alternative embodiment, processor 210 checks the state of phase-change memory cell 230 periodically during run-time. If at any time a change in state is detected, a security action may be taken.

One advantage of smart card semiconductor chip 200A is that the optical energy of the laser will change the state of phase-change memory cell 230 even when smart card semiconductor chip 200A is not being powered. Thus, an attack attempted when smart card semiconductor chip 200A is turned off will be detected after startup.

Phase-change memory cell 230 functions as both a sensor and a memory device. Phase-change memory cell 230 is configured to be optically programmed so that an unauthorized attack by, for example, a laser will program phase-change memory cell 230 directly, and its state can then be read electrically. There is no need for a separate photodiode and memory device.

Figure 2B:
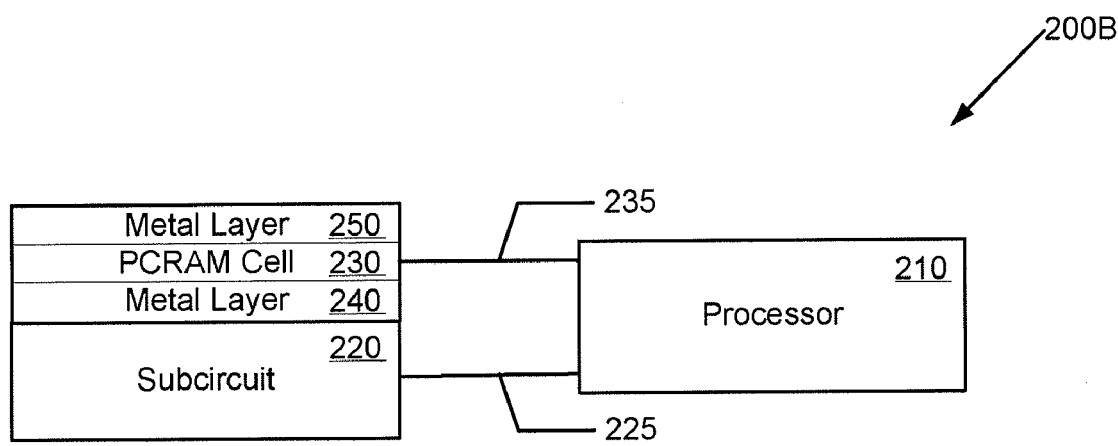
FIG. 2B illustrates a block diagram of a smart card semiconductor chip in accordance with another exemplary embodiment.

FIG. 2B illustrates a block diagram of a smart card semiconductor chip 200B in accordance with another exemplary embodiment.

Smart card semiconductor chip 200B is similar to smart card semiconductor chip 200A of FIG. 2A, except that the location of phase-change memory cell 230 is further specified. More specifically, phase-change memory cell 230 may be placed between final metallization layer 250 and penultimate metallization layer 240. As is known, a metallization layer is a thin film of conductive metal deposited onto a wafer or substrate by use of, for example, chemical or physical vapor deposition. Of course there are generally additional metallization layers included in smart card semiconductor chip 200B, but only two are shown for the sake of simplicity.

Figure 2C:
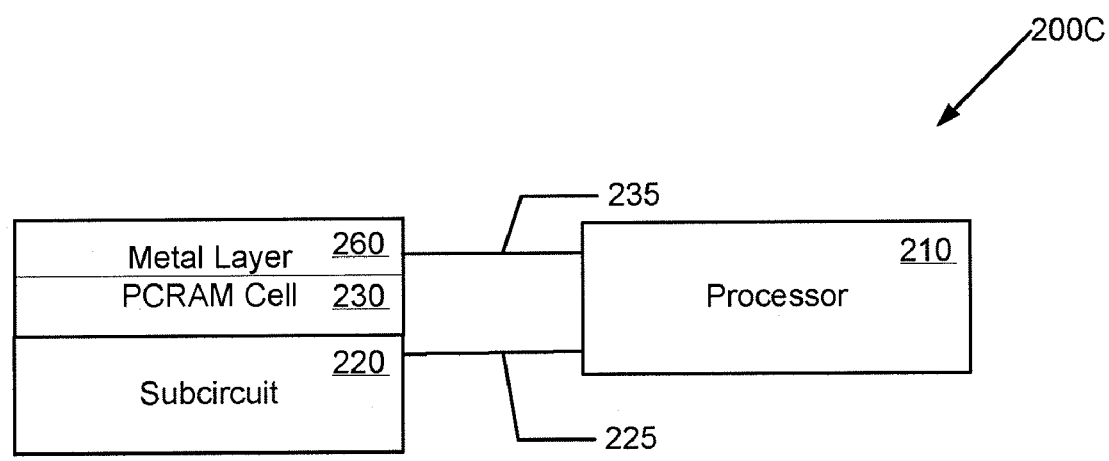
FIG. 2C illustrates a block diagram of a smart card semiconductor chip in accordance with another exemplary embodiment.

FIG. 2C illustrates a block diagram of a smart card semiconductor chip 200C in accordance with another exemplary embodiment.

Smart card semiconductor chip 200C is similar to smart card semiconductor chip 200A of FIG. 2A, except that the location of phase-change memory cell 230 is further specified. Phase-change memory cell 230 may be placed between subcircuit 220 and first metallization layer 260. Again, there are generally additional metallization layers included in smart card semiconductor chip 200B, but only one is shown for the sake of simplicity Although only a single phase-change memory cell 230 is shown for the sake of simplicity in each of the exemplary embodiments of FIGS. 2A-2C, any number of phase-change memory cells 230 may be used. For example, a single phase-change memory cell 230 may be used. Alternatively, phase-change memory cells 230 may be distributed uniformly about smart card semiconductor chip 200. Alternatively, phase-change memory cells 230 may be formed above any or all security-critical subcircuits 220 of smart card semiconductor chip 200. Also, multiple phase-change memory cells 230 may be formed above a single subcircuit 220.

FIG. 3 illustrates a flowchart 300 of a security method corresponding to the smart card semiconductor chips 200 shown in FIGS. 2A-2C.

Initially, at Step 310, subcircuit 220 is formed in a substrate. Next, phase-change memory cell 230 is formed on the subcircuit 220, at Step 320. In operation, a light attack on subcircuit 230 will be detected directly by phase-change memory cell 230, and phase-change memory 230 will change state in response thereto, at Step 330. Next, processor 210 reads the state of phase-change memory cell 230 in the manner discussed above, at Step 340. If processor 210 detects a change in state, finally, at Step 350, a security action will be triggered.

Figure 4A:
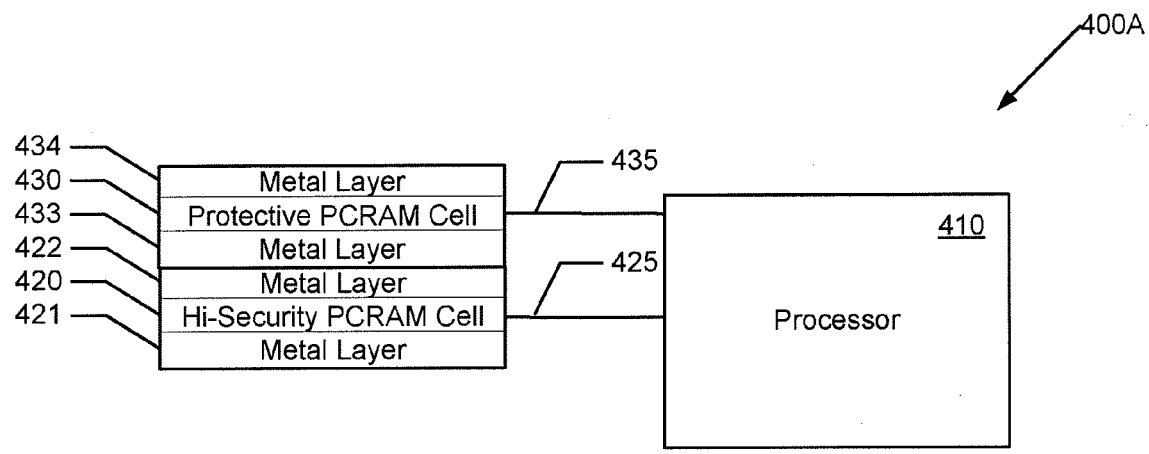
FIG. 4A illustrates a block diagram of a smart card semiconductor chip in accordance with another exemplary embodiment.

FIG. 4A illustrates a block diagram of a smart card semiconductor chip 400A in accordance with another exemplary embodiment.

Smart card semiconductor chip 400A includes processor 410, high-security phase-change memory cell 420 coupled to processor 410 via conductive line 425, and protective phase-change memory cell 430 coupled to processor 410 via conductive line 435. High-security phase-change memory cell 420 is formed between metallization layer 421 and metallization layer 422. Similarly, protective phase-change memory cell 430 is formed between metallization layer 433 and metallization layer 434. High security phase-change memory cell 420 is configured to store security-critical information, and protective phase-change memory cell 430 is added for security against probe attacks.

In this exemplary embodiment, protective phase-change memory cell 430 is used as an active or passive shield to protect high-security phase-change memory cell 420 formed further within semiconductor chip 400A from probe attacks. Protective phase-change memory cell 430 can store a checksum or any other data value that can be used to determine if data in protective phase-change memory cell 430 has been altered, and high-security phase-change memory cell 420 forms a security critical portion of the circuit of semiconductor chip 400A.

During an attack, the attacker may attempt to place a probe on semiconductor chip 400A to read signals in high-security phase-change memory cell 420. In order to do this, the attacker must remove or rewire outer metallization layers 433, 434 in order for the probe to gain access to lower metallization layers 421, 422 and high-security phase-change memory cell 420. Since protective phase-change memory cell 430 is integrated within the outer metallization layers 433, 434, in order to remove or rewire these outer metallization layers 433, 434, the attacker must necessarily remove or alter protective phase-change memory cell 430. When processor 410 subsequently attempts to read protective phase-change memory cell 430, if protective phase-change memory cell 430 had been removed there would obviously be no response. If protective phase-change memory cell 430 had been merely altered, the stored data would have been changed, as can be detected by processor 410 in the manner as described above with respect to FIG. 2A. In either case, an attempted attack would thereby be detected, and a security action may then be triggered. The security action may be generating an alarm and/or taking other appropriate protective action, such as circuit shut-down, erasing of data, etc.

Processor 410 may check the state of protective phase-change memory cell 430 at any time suitable. In one embodiment, processor 410 checks the state of protective phase-change memory cell 430 during start-up. In an alternative embodiment, processor 410 checks the state of protective phase-change memory cell 430 periodically during run-time. If at any time a change in state is detected, or no state is detected due to protective phase-change memory cell 430 having been removed or destroyed, a security action may be triggered.

Although only a single shielding protective phase-change memory cell 430 and a high security phase-change memory cell 420 are shown for the sake of simplicity, any number of high-security phase-change memory cells 430 or protective phase-change memory cells 430 may be used. For example, a single protective phase-change memory cell 430 may be used. Alternatively, protective phase-change memory cells 430 may be distributed uniformly about smart card semiconductor chip 400A. Alternatively, protective phase-change memory cells 430 may be formed to at least partially underlie or overlie any or all high-security phase-change memory cells 420 of smart card semiconductor chip 400A. Also, more than one protective multiple phase-change memory cell 430 may be formed to at least partially overlie or underlie a single high-security phase-change memory cell 420 storing security-critical data.

Figure 4B:
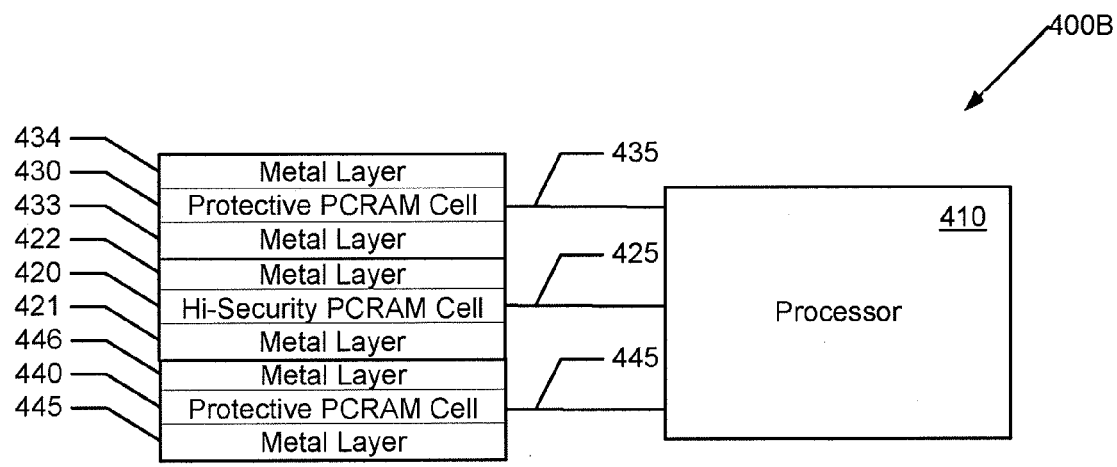
FIG. 4B illustrates a block diagram of a smart card semiconductor chip in accordance with another exemplary embodiment.
Figure 6:
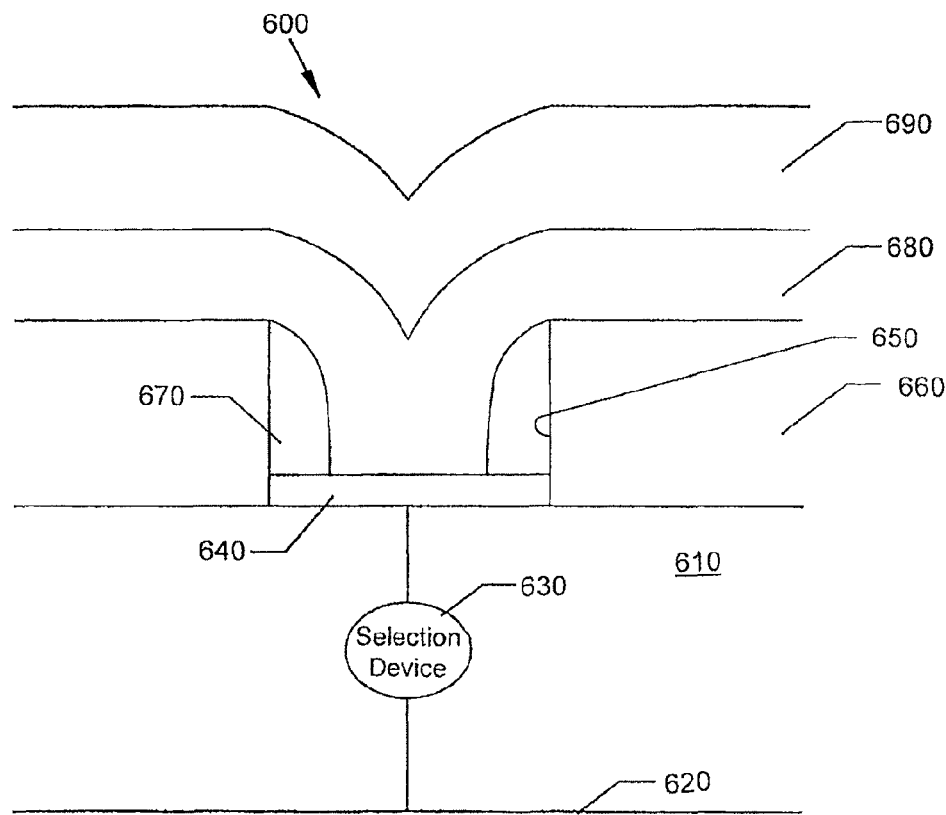
FIG. 6 illustrates a cross-section of a phase-change memory cell.

FIG. 4B illustrates a block diagram of a smart card semiconductor chip 400B in accordance with another exemplary embodiment.

Smart card semiconductor chip 400B is similar to smart card semiconductor chip 400A of FIG. 4A, except that smart card semiconductor chip 400B includes an additional protective phase-change memory cell 440 formed on an opposite side of high-security phase-change memory cell 420 from protective phase-change memory cell 430. Protective phase change-memory cell 440 is formed between metallization layer 445 and metallization layer 446. Since an attack may occur from either side of smart card semiconductor chip 400B, high security phase-change memory cell 420 is sandwiched between protective security phase-change memory cells 430 and 440.

If an attacker attempts to place a probe on the side of semiconductor chip 400B with protective phase-change memory cell 440 to read signals in high-security phase-change memory cell 420, the attacker must remove or rewire metallization layers 445, 446 in order for the probe to gain access to lower metallization layers 421, 422 and high-security phase-change memory cell 420. Since protective phase-change memory cell 440 is integrated within the metallization layers 445, 446, in order to remove these outer metallization layers 445, 446 the attacker must necessarily remove protective phase-change memory cell 440. If processor 410 subsequently attempts to read the removed protective phase-change memory cell 440, there would obviously be no response. If protective phase-change memory cell 440 had been merely altered, the stored data would have been changed, as can be detected by processor 410 in the manner as described above with respect to FIG. 2A. In either case, an attempted attack would thereby be detected, and a security action may be triggered.

As with the other embodiments, smart card semiconductor chip 400B is not limited by any particular number of phase-change memory cells 420, 430, 440. Also, it should be appreciated that although the embodiments have been described with a particular number of metallization layers, the application is not limited in this respect. Phase change memory cells, or a phase change memory cell and a subcircuit, can be separated by any number of metallization layers.

FIG. 5 illustrates a flowchart of a security method corresponding to the smart card semiconductor chips 400 shown in FIGS. 4A and 4B.

Initially at Step 510, a high-security phase-change memory cell 420 configured to store security critical information is formed. Also, a protective phase-change memory cell 430 and/or a protective phase-change memory cell 440 is formed to at least partially overlie or underlie high-security phase-change memory cell 420, at Step 520. In operation, high-security phase-change memory cell 420 will be shielded from physical access by protective phase-change memory cell 430 and/or protective phase-change memory cell 440, at Step 530. Next, processor 410 attempts to read the state of protective phase-change memory cell 430 and/or protective phase-change memory cell 440, in the manner discussed above, at Step 540. Finally, at Step 550, if at any time processor 410 detects a change in state or no state is detected due to protective phase-change memory cell 430, 440 having been removed or destroyed, a security action will be triggered.

Although security method 500 of FIG. 5 for detecting probe attacks has been described as being applicable to smart card memory chips 400A and 400B having a high-security phase-change memory cell 420, the application is not limited in this respect. Security method 500 of FIG. 5 may alternatively be used with smart card semiconductor chips 200A, 200B, and 200C shown in FIGS. 2A, 2B, and 2C, respectively. In other words, phase-change memory cell 230 may be used to shield subcircuit 220 against not only light attacks, but also probing attacks as described above with respect to the method of FIG. 5.

Also, although security method 300 of FIG. 3 for detecting light attacks has been described as being applicable to smart card memory chips 200A, 200B, and 200C, each having subcircuit 220, the application is not limited in this respect. Security method 300 described with respect to FIG. 3 is alternatively applicable to smart card semiconductor chips 400A and 400B shown in FIGS. 4A and 4B, respectively. In other words, protective phase-change memory cell 430 and/or protective phase-change memory cell 440 may be used to not only detect probing attacks on high-security phase-change memory cell 420, but also detect light attacks as described above with respect to the method of FIG. 3.

Although specific embodiments have been illustrated and described herein, it will be appreciated by those of ordinary skill in the art that a variety of alternate and/or equivalent implementations may be substituted for the specific embodiments shown and described without departing from the scope of the present application. This application is intended to cover any adaptations or variations of the specific embodiments discussed herein.

What is claimed is:

1. A semiconductor chip comprising:
    a subcircuit;
    a phase-change memory cell located on or close to the subcircuit, and configured to directly detect an attack on the subcircuit; and
    a processor configured to read the phase-change memory cell periodically during runtime, and trigger a security action if an attack is detected.

2. The semiconductor chip of claim 1, wherein the attack is a light attack.

3. The semiconductor chip of claim 1, wherein data stored in the phase-change memory cell is changed during the attack.

4. The semiconductor chip of claim 3, wherein the phase-change memory cell is further configured to store a checksum used to indicate that the attack occurred.

5. The semiconductor chip of claim 1, wherein the attack is a probe attack, and the phase change memory cell forms a shield to prevent physical access to the subcircuit.

6. A semiconductor chip comprising:
    a first phase-change memory cell;
    a second phase-change memory cell at least partially overlying or underlying the first phase-change memory cell, and configured to directly detect an attack on the first phase-change memory cell;
    a third phase-change memory cell located on an opposite side of the first phase-change memory cell from the second phase-change memory cell; and
    a metallization layer located on each side of the first phase-change memory cell, the second phase-change memory cell, and the third phase-change memory cell.

7. The semiconductor chip of claim 6, wherein the attack is a probe attack, and the second phase change memory cell forms a shield to prevent physical access to the first phase-change memory cell.

8. The semiconductor chip of claim 6, wherein the attack is a light attack.

9. The semiconductor chip of claim 6, further comprising a processor configured to read the second phase-change memory cell.

10. A method of protecting a subcircuit of a semiconductor chip comprising:
    detecting an attack on the subcircuit directly by a phase-change memory cell formed on or close to the subcircuit, wherein the detecting comprises reading the phase-change memory cell periodically during runtime; and
    triggering a security action if an attack is detected.

11. The method of claim 10, wherein the detecting comprises detecting that data stored in the phase-change memory cell has been changed.

12. The method of claim 10, wherein the attack is a light attack.

13. The method of claim 10, wherein the attack is a probe attack, and the phase-change memory cell is configured to shield the subcircuit from physical access by the probe.

14. A method of protecting a subcircuit of a semiconductor chip comprising:
    detecting an attack on the subcircuit directly by a phase-change memory cell formed on or close to the subcircuit, wherein the detecting comprises reading the phase-change memory cell at startup; and
    triggering a security action if an attack is detected.

15. A method of protecting a first phase-change memory cell of a semiconductor chip comprising:
    detecting an attack on the first phase-change memory cell directly by a second phase-change memory cell at least partially overlying or underlying the first phase-change memory cell, wherein the detecting comprises reading the second phase-change memory cell periodically during runtime; and
    triggering a security action if an attack is detected.

16. The method of claim 15, wherein the detecting comprises detecting that data stored in the second phase-change memory cell has been changed.

17. The method of claim 15, wherein the attack is a light attack.

18. The method of claim 15, wherein the attack is a probe attack, and the second phase-change memory cell is configured to shield the first phase-change memory cell from physical access by the probe.

19. The method of claim 15, further comprising detecting an attack on the first phase-change memory cell directly by a third phase-change memory cell formed on a side of the first phase-change memory cell opposite the side on which the second phase-change memory cell is formed.

20. A method of protecting a first phase-change memory cell of a semiconductor chip comprising:
    detecting an attack on the first phase-change memory cell directly by a second phase-change memory cell at least partially overlying or underlying the first phase-change memory cell,
    wherein the detecting comprises reading the second phase-change memory cell at startup; and
    triggering a security action if an attack is detected.

* * * * *